United States Patent [19]
Zucker et al.

[11] Patent Number: 5,109,203
[45] Date of Patent: Apr. 28, 1992

[54] GENERATED AND METHOD FOR GENERATING MICROWAVES

[75] Inventors: Oved S. F. Zucker, Del Mar; James R. Long, LaJolla, both of Calif.

[73] Assignee: Energy Compression Research Corp., Del Mar, Calif.

[21] Appl. No.: 855,454

[22] Filed: Apr. 24, 1986

[51] Int. Cl.$^5$ .......................................... H03B 28/00
[52] U.S. Cl. ..................................... 331/96; 331/172; 331/173
[58] Field of Search ................... 331/96, 99, 172, 173; 307/106, 117, 311, 108; 328/63; 333/13, 20

[56] References Cited

U.S. PATENT DOCUMENTS

| | | | |
|---|---|---|---|
| 3,484,619 | 12/1969 | Proud | 307/106 |
| 3,917,943 | 11/1975 | Auston | 250/211 J |
| 4,176,295 | 11/1979 | Driver et al. | 315/39 |
| 4,218,618 | 8/1980 | Mourou | 250/211 J |
| 4,329,686 | 5/1982 | Mourou | 342/202 |
| 4,568,889 | 2/1986 | Bayraktaroglu | 331/96 X |

OTHER PUBLICATIONS

Auston, D. H. "Picosecond Optoelectronic Switching and Gating In Silicon" *Applied Physics Letters* vol. 26, No. 3, Feb. 1, 1975, pp. 101–103.
Lee, C. H. "Picosecond Optoelectronic Switching In GaAs" *Applied Physics Letters* vol. 30, No. 2, Jan. 15, 1977, pp. 84–86.
Lee, C. H. et al. "Optical Control Of Millimeter-Wave Propagation In Dielectric Waveguides" *IEEE Journal Of Quantum Electronics* vol. QE-16, No. 3, Mar. 1980, pp. 277–288.
"A Kilovolt Picosecond Optoelectronic Switch and Pockel's Cell", LeFur et al., Appl. Phys. Lett., vol. 28, No. 1, Jan. 1976.
"Megawatt Nanosecond Switching of High-Power Silicon Switches," Zucker, Long & Smith, 12 Modular Symposium, Feb. 1976.
"Experimental Demonstration of High-Power, Fast Rise Time Switching In Silicon Junction Semiconductors", Apply. Phys. Lett. 29 (4,15), Aug. 1976.
"Light Activated Semiconductor Switches", Preprint UCRL-80046, O. S. F. Zucker, Oct. 1977.
"High Frequency Wave Form Generation Using Optoelectronic Switching In Silicon", Proud et al., IEEE Transactions on Microwave Theory and Techniques, vol. MTT-26, No. 3, Mar. 1978.
"High-Power Switching With Picosecond Precision", Mourou et al., Appl. Phys. Lett. 35(7), Oct. 1979.
"Optically Controllable Millimeter Wave Phase Shifter", DeFonzo et al., Appl. Phys. Lett. 38(6), Oct. 1979.
"Picosecond Microwave Pulse Generator", Mourou et al., Appl. Phys. Lett. 38(6), Mar. 1981.
"Picosecond High-Power Switching and Applications", Mourou et al., Laser Focus, Apr. 1982.
"Advances In Picosecond Optoelectronics", Mourou et al., SPIE vol. 322 Picosecond Lasers and Applications, 1982.

*Primary Examiner*—David Mis
*Attorney, Agent, or Firm*—Marks Murase & White

[57] ABSTRACT

A source for generating microwaves using sequential switching of cascaded TEM transmission lines of arbitrary lengths charged to arbitrary voltages where the delay between any two switches is equal to or greater than the temporal length of the transmission line separating them, the first switch activated being the one closest to the load. The source uses an optimized transmission line and switch geometry which yields the highest possible power flow. Various folded configurations of the source which provides added compactness and simplified energizing are also disclosed.

54 Claims, 7 Drawing Sheets

GENERATED AND METHOD FOR GENERATING MICROWAVES

BACKGROUND OF THE INVENTION

1. Field of the Invention

The present invention relates to a method and apparatus for generating microwaves and more particularly to a microwave source and a method for generating microwaves by digital synthesis.

2. Background of the Invention

While the present invention has broad application in many fields, such as communications and power transmission, it is especially suitable for use in the generation of extremely high power microwave pulses (a burst of microwave energy), preferably in the form of several cycles of a periodic sine or square wave, in the GHz regime.

The general concept of producing microwaves by a sequential operation of switches is well known. High peak power microwave generation is addressed by Driver et al. in U.S. Pat. No. 4,176,295 in which the generation of microwaves by periodically discharging a plurality of identical, direct current energized, resonant transmission lines into a TE wave guide at half-multiple wavelength spacings is discussed. To periodically discharge the transmission lines, each is provided with a light activated solid state (LASS) diode switch, the LASS diode switches being simultaneously operated by laser beams of equal optical path length to cause the electromagnetic energy in the waveguide to propagate as a pulse train of microwave energy.

Mourou, in U.S. Pat. No. 4,329,686 discusses an arrangement, similar to that of Driver et al., which uses a TE waveguide and a LASS switch for generating microwave pulses of picosecond duration, synchronously and in response to laser light pulses.

Unfortunately, the arrangements described by Driver et al. and Mourou do not produce clean microwave pulses and are limited in power since TE waveguides have impedances close to that of free space, typically 50 ohms or more, and therefore cause the LASS switches to operate outside the electric field and current density limits consistent with good high power design principles, specifically, unidirectional power flow in a continuously matched system.

Zucker, in "Light Activated Semiconductor Switches," UCRL Preprint, Oct. 1977 discusses the use of a light-activated semiconductor switch, the basic principle of which is to create carriers in situ, thus obviating the need for diffusing the carriers necessary to transition a transistor or thyristor switch from a reversed biased (OFF) condition to a foreward biased (ON) condition. Zucker discusses the use of a laser beam whose frequency is matched to the switching device band gap (1.09eV for silicon) to turn ON a LASS switch in less than 1 ps. As discussed in the article, a switch having sub nanosecond turn on time, and capable of immediate turn off after current ceases to flow, would be required for microwave generation in order to allow for quick recharge and refire and for the establishment of coherence among independent microwave sources.

Such a switch is addressed by Proud et al. in their article "High Frequency Waveform Generation Using Optoelectronic Switching in Silicon" IEEE Trans on Microwave Theory and Techniques, Vol. MTT-26, No. 3 (1978), in which the conversion of dc energy into RF pulses by using an array of silicon switches simultaneously activated by a laser pulse is discussed Proud et al. envision a frozen wave generator comprising arrays of high-resistivity silicon switches fired by a gas laser designed to simultaneous fire all of the switches in exact synchronism.

Mourou et al. in their article entitled "Picosecond Microwave Pulse Generation", Appl. Phys. Lett. 38(6) (1981) discuss the generation of a microwave burst in picosecond synchronization with an optical pulse using a LASS switch coupled to an x-band waveguide and describe the efforts of others to generate microwave pulses using electrically driven spark gaps and frozen wave pulses using LASS switching.

LeFur and Auston, in their article "A Kilovolt Picosecond Optoelectronic Switch and Pockel's Cell" Applied Phys. Letters, Vol. 28, No. 1 (1976) pp. 21-23 discuss a silicon switch which is turned on by absorption of a 5 psec optical pulse from a mode locked Nd:glass laser. LeFur and Auston contemplate the combination of a silicon switch and Pockel's cell in order to efficiently switch large optical signals by small optical signals at high speed.

The virtues of LASS switches over other high power switches such as the spark gap and SCR has long been recognized. The spark gap has a high power handling and a fast current rise time capability but is short lived. The conventional semiconductor switch has the ability to handle moderately high powers and is long lived but is relatively slow since it relies on charge carriers diffusing laterally into a junction for switching. LASS switches, by means of optical carrier generation, in essence provide thyristors or other junction devices with a current rise time capability in the nanosecond to picosecond range and thus combine the junction device high power handling capability and long life with fast rise time.

However, while various schemes for generating microwaves using LASS switches are known, no truly effective digitally synthesized microwave sources are presently available. In addition, there exists a need for a microwave source which can project significant amounts of microwave energy at a predetermined point in space, a need which requires a plurality of individual sources timed to be coherent with one another, a need not satisfied by prior art devices. There also exists an unfulfilled need for a microwave source which can produce either continuous microwave energy or short bursts of microwave energy of high magnitude Further, no available high power microwave sources have sufficient intersource coherence to generate phase coherent microwave pulses from a phased array of microwave sources.

SUMMARY OF THE INVENTION

It is therefore an object of the present invention to provide a method and apparatus for generating high power microwave pulses.

It is a further object of the invention to provide a method and apparatus for digitally synthesizing microwaves.

It is still a further object of the invention to provide a method and apparatus for establishing coherence among several independent microwave sources.

It is yet a further object of the present invention to provide a method and apparatus for microwave generation in the TEM mode by providing for unidirectional power flow in a continuously matched system of sequentially switched cascaded transmission lines.

It is a further object of the present invention to provide a simple microwave source of compact configuration.

Additional objects, advantages and novel features of the invention will be set forth in the description which follows and in part will become apparent to those skilled in the art upon examination of the following or may be learned by practice of the invention.

In accordance with the invention there is provided a method and apparatus for providing a high power, phase coherent microwave source using LASS technology. There is also provided a method and apparatus for fanning out, balancing and phasing a large number of microwave sources into a broad array or alternatively, for driving a large number of independent microwave generators coherently.

Because of the flexibility of LASS microwave generation the present invention contemplates several approaches to generating high power, wide bandwidth microwave packets. For example, according to one aspect of the invention the frequency of all of the waves in a single packet of microwaves can be changed by stretching out laser initiation pulses. This results in a packet of square waves stretched out to form a longer packet with a lower fundamental frequency. It is important to note that while this technique offers a continuum of wavelengths from the fundamental (geometrical) wavelength, the average power density of the packet will drop from its peak (square wave) level. It should be understood that waveforms other than square waves can also be generated by the proper selection of charge voltage and switch timing.

Alternatively, according to another aspect of the invention, a microwave packet with variable frequencies but with maximum power density is provided by fabricating the source with variable length transmission lines In a manner similar to that described above, the microwaves generated by this embodiment may also be stretched out by suitably delaying the laser activation pulses.

Further, in accordance with yet another aspect of the invention, the electrical geometry of a microwave source can be dynamically modified In this case, the source would preferably be a series of matched transmission lines, each being fabricated at a fraction of the smallest geometrical wavelength of interest for a specific application. The source would be "electrically" conditioned by laser irradiation of selected LASS switches to effectively increase the geometrical wavelength of one or more transmission lines of the source. Subsequently, each of the cascaded transmission lines of the system are charged to a predetermined potential, the magnitude of which may be arbitrarily chosen, and discharged by a second set of laser pulses. The frequency distribution in the wavepacket can be suitably modified by the timing of laser activation sequence.

The choice among the various LASS microwave generation sources may be tailored according to the needs of a particular application.

For example, a phased array of LASS microwave sources may be used to project microwaves at a predetermined three dimensional coordinate. The invention may use picosecond timing of LASS switches to synchronize widely separated generators to produce coherent microwave pulses. For example, a phased array can be constructed where each array source is a separate generator. Since optical synchronization does not require optical coherence, the laser requirements remain rather modest. In accordance with an aspect of the present invention, timing can be provided with properly trimmed optical fibers. Alternatively, optical delay lines can be used in order to fire an array of distributed sources at the instants required to create a constructive microwave interference pattern.

As will be appreciated from the above, the present invention contemplates four aspects, each of which can be used alone or in conjunction with other:

(1) Sequential switching of two or more cascaded TEM transmission lines of arbitrary lengths, each transmission line being charged to an arbitrary voltage where the delay between any two switching events is equal or greater than the temporal length of the transmission line separating them with the first switch activated being the one closest to the load.

(2) The use of an optimized transmission line and switch geometry to yield the highest possible power flow.

(3) A "folded" microwave source configuration to provide added compactness and simplified energizing of the transmission lines.

(4) The use of reverse biased light activated solid state diodes as switches to provide for extremely rapid switch recovery upon recharging of the transmission lines after discharge, the recharging operating to forcefully reverse bias the diodes.

BRIEF DESCRIPTION OF THE DRAWINGS

The accompanying drawings, which are incorporated in and form a part of the specification, illustrate various presently preferred embodiments of the invention, and, together with the description, serve to explain the principles of the invention. In the drawings.

DETAILED DESCRIPTION OF THE INVENTION

Reference will now be made in detail to the presently preferred embodiments of the invention, examples of which are illustrated in the accompanying drawings.

As alluded to above, various schemes for producing microwaves by switching various constant voltage and uniform geometry sources are known in the art. In accordance with the present invention, it is now possible to achieve high power operation with great waveform flexibility using LASS switches to sequentially switch cascaded transmission lines operated at low impedance, e.g. 1 ohm or less, to take advantage of the high current density limit of LASS switches. One aspect of the present invention involves providing a microwave source having LASS switches where the switch configuration falls within certain dimensional parameters for maximizing the power flow through the source. In order to obtain optimal output power commensurate with electric field limitations, current density limitations, wavelength and related dimensions in the entire system (transmission lines, semiconductor switch, etc.) a configuration that provides continuously matched, uninterrupted power flow with the Poynting vector at the maximum possible field limit (E and H) is required In general the power flow in a wave guide or transmission line is given by the expressions:

$$P = V^2/Z_o, \text{ or} \qquad 1(a)$$

$$\bar{P} = \bar{E} \times \bar{H} \qquad 1(b)$$

where V is the wave voltage, Zo is the wave guide or transmission line impedance, and P is the Poynting vector.

V is fixed by the electric field limit of the switch, by the microwave wavelength and by the transmission line and switch lengths which, as explained in detail below, are required to be smaller than the microwave wavelength. Since V is fixed, P can be increased only by reducing Zo.

Unfortunately, by their very nature TE and TM waveguides, such as those used in some of the prior art, have impedances close to that of free space, typically 50 ohms or more. On the other hand, in the TEM mode transmission line spacing can be much smaller than the microwave wavelength, thus, impedances of a fraction of an ohm are allowed and can therefore be employed. As developed in detail below, the optimum impedance level is that which permits operation at both the electric field and current density limits commensurate with sound design and suppression of parasitics.

MICROWAVE GENERATION

As alluded to above, the present invention contemplates microwave generation in the TEM mode, which not only permits high power operation, but also provides for unidirectional power flow in a continuously matched system obtained through sequential switching. The present invention also contemplates various switching schemes for modulation purposes and various geometrical configurations which provide maximum power flow and which simplify electrical charging of the transmission line, resulting in great compactness. The preferred embodiment of a basic microwave generator according to present invention is illustrated in FIG. 1A.

Figure 1A:
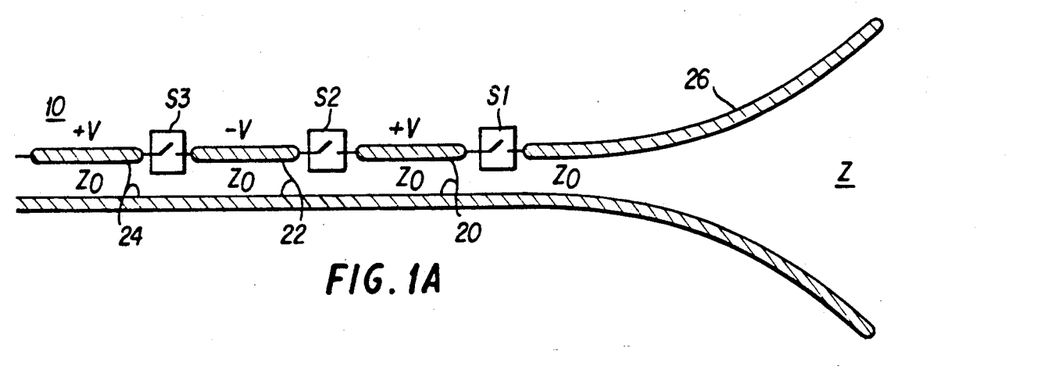
FIG. 1A is a schematic representation of a microwave source with LASS switches depicted as idealized mechanical switches.

The microwave source 10 illustrated in FIG. 1A comprises a series of matched transmission line pairs 20, 22, 24 of impedance Zo, connected in cascade by switches $S_1$, $S_2$, $S_3$ shown schematically as ideal switches. In the embodiment illustrated in FIG. 1A, the transmission line pairs 20, 22 and 24 each have a length $l \leq \lambda/4$ and are alternately charged to $+V$ and $-V$. As will become apparent from the discussion below, transmission line segments of length other $\lambda/4$ can also be advantageously employed and the transmission line segments can be charged to any arbitrary voltage The first transmission line 20 is connected to a transformer such as exponential or adiabatic horn 26 which starts at impedance Zo and slowly opens out to reach an impedance Z which couples efficiently with that of free space or of a waveguide. The transformer or horn 26 may advantageously be wholly or partially filled with dielectric material having a dielectric constant which may be either a constant or varying magnitude in order to match an arbitrary load. The purpose of the horn 26 is to match the low TEM transmission line impedance to the high antenna impedance or conventional TE or TM waveguide impedance.

Figure 1B:
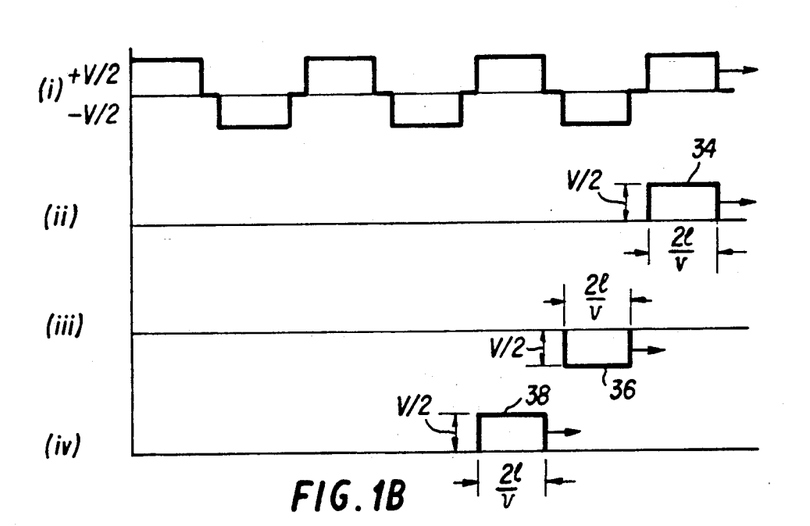
FIG. 1B is a graphical depiction of a microwave pulse generated using the source of FIG. 1A illustrating one possible timing sequence.

To generate microwaves, switch S1 is first closed. As illustrated in FIG. 1B this produces a pulse 34 of height V/2 and duration 2l/v, where v is the speed of the propagating pulse in the transmission line and 1 is the length of one segment of the transmission line, traveling into the matched horn 26. In this case the pulse duration, 2l/v is less than or equal to one half the microwave period to be generated. Since switch S2 is open, this transmission line is discharged completely. The pulse travelling into the horn 26 rises in voltage to maintain its power, $V^2/Z$, constant. Thus, for example, as the wave transforms from 1 ohm to 100 ohms, the wave voltage rises from 1.0V to 10.0V. The maintenance of uniform microwave power flow (backward moving waves still constitute foreward moving power flow) is one of the elements providing for extremely high power and power density capability.

Switch S2 in FIG. 1A can be closed any time after the voltage at the "left" end of the first transmission line 20 reaches zero This means that the time between switching is greater than or equal to 2l/v. When switch S2 is closed, a negative pulse, 36, of amplitude $-V/2$ is launched to the right as viewed in FIG. 1A. The pulse 36 encounters the matched first line 20 terminated by the matched horn 26. Thus, the process operates entirely in the matched condition regardless of delay time variation which is of course also the maximum power condition. Similarly, after the transmission line 22 has been discharged, switch S3 may be closed, producing the discharge pulse 38 at the transmission line 22 having magnitude $+V/2$ and duration $2l_{24}/V$ (where $l_{24}$ is the length of transmission line segment 24), which also moves to the right as viewed in FIG. 1B.

The combination of these pulses and an additional suceeding pulses is shown in FIG. 1B(i).

This sequencing method, in contrast to the frozen wave approach of Proud, provides for waves which travel the shortest possible distance to the antenna thus reducing attenuation and dispersion and allowing for a significantly increased number of cascaded lines (and thus in the number of pulses or cycles which can be generated from a single source) as well as a reduction in the total charge from a single source transferred by each switch which in turn reduces total switch losses.

More significantly, and in contrast to the frozen wave approach, the present invention permits instantaneous variation in frequency (and phase) for the purpose of wide band modulation by allowing for transmission line segments of variable length, the discharge of each transmission line being controlled by an independently operated switch.

Figure 1C:
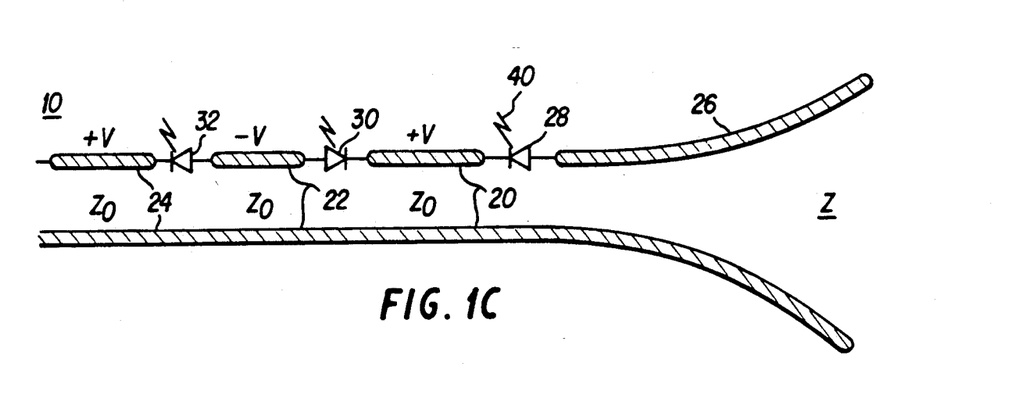
FIG. 1C is a schematic representation of a microwave source with LASS switches depicted as reversed biased diodes.

Referring now to FIG. 1C there is depicted a microwave source in which switches 28, 30, 32, which correspond to switches S1, S2 and S3 respectively of FIG. 1A, are represented as LASS diodes positioned so that each is reverse biased by the alternating charge voltages on transmission line pairs 20, 22 and 24. In that condition, the diodes 28, 30 and 32 are reverse biased. "Closing" of a diode switch, in the sense of turning the diode on, is performed by the selective impaction of optical pulses, having a wavelength closely matched to the bandgap of the LASS material (approximately 1.1 eV in silicon) and indicated in FIG. 1C by flashes 40, into the individual LASS diode. The photons thus impacted produce carriers (electrons and holes) thereby rendering the diode conducting.

Upon the discharge of a transmission line pair, an intrinsic or amorphous semi-conductor switch will normally remain conductive for the duration of the carrier lifetime. Since the carrier lifetime duration in silicon is approximately 100 microseconds, practically no carriers are lost in the nanosecond or picosecond range of interest for producing microwaves. Further, in some of the prior art LASS switches discussed above intrinsic or amorphous semiconductor materials are used which make it difficult to recharge the transmission lines for rapid refiring, necessitating use of short carrier lifetime materials such as Ga-As, an immature technology relative to silicon. In addition, a short carrier lifetime requires more laser light energy to maintain carrier density. One aspect of the present invention is that the recharging of a transmission line pair for a repeat discharge operates to reverse bias the LASS diode switch, thereby forcefully draining the charge from the semiconductor material resulting in the "opening" of the diode switch This process can be achieved in times significantly less than the carrier lifetimes and provides for a high repetition rate capability. As a result, the time between repeated firing of the source 10 may be made equal to or less than the microwave burst time.

Some of the factors pertinent to the selection of intrinsic semiconductor material or junction devices for microwave generation are as follows. Junction devices are voltage limited to about 15 kV across their reversed biased junction but intrinsic devices hold a voltage proportional to their length (E must be less than 100kV/cm). However, as discovered by applicants for microwave generation, the practical length of a switch has to be small relative to the microwave wave length to minimize reflection losses. Moreover, junction devices can be connected in series if voltage drops in excess of 15 kV are required. In intrinsic devices, the "open" state has to be rather short (10 ns) due to the low "open" resistance (typically $10^4$ ohm-cm) to prevent discharge of current and/or damage to the semiconductor. On the other hand, reverse biased junctions exhibit resistivities up about $10^{10}$ ohm-cm. In addition, for high current densities, conductor bonding to semiconductors have to be controlled, both metallurgically and for doping.

Thus, the preference of junction devices over intrinsic material for microwave generation arises from their desirable high repetition rate capability, and their "high" open impedance. Further, even though the required switch length, dictated by the wavelength considerations discussed below (switch length equal to about $\lambda/40$), limits the maximum voltage to less than 15 kV (which is the maxiumum attainable by junction devices), for higher voltages, multijunction diode devices may be used as switches, the junctions being in series with the matched transmission lines so as to be able to support a higher voltage drop. Moreover, with either junction devices or intrinsic materials, transmission line contact to the semiconductor switch requires doping which is easily accomplished employing mature junction device technology.

DESIGN CONSTRAINTS

An analysis of the fundamental constraints in designing a microwave generator for digitally synthesizing microwaves will now be discussed in connection with FIG. 2. As will be apparent from the analysis, the fundamental constraints limiting power are the switch and transmission line geometry as well as the maximum electric field and maximum current density sustainable by the switch In FIG. 2 the numeral 11 generally depicts a TEM transmission line pair 12 having a LASS switch 14 inserted in a line 16 of the transmission line pair 12. A portion 18 of the line 16 is charged to $-V$ and a portion 19 of the line 16 is charged to $+V$.

Figure 2:
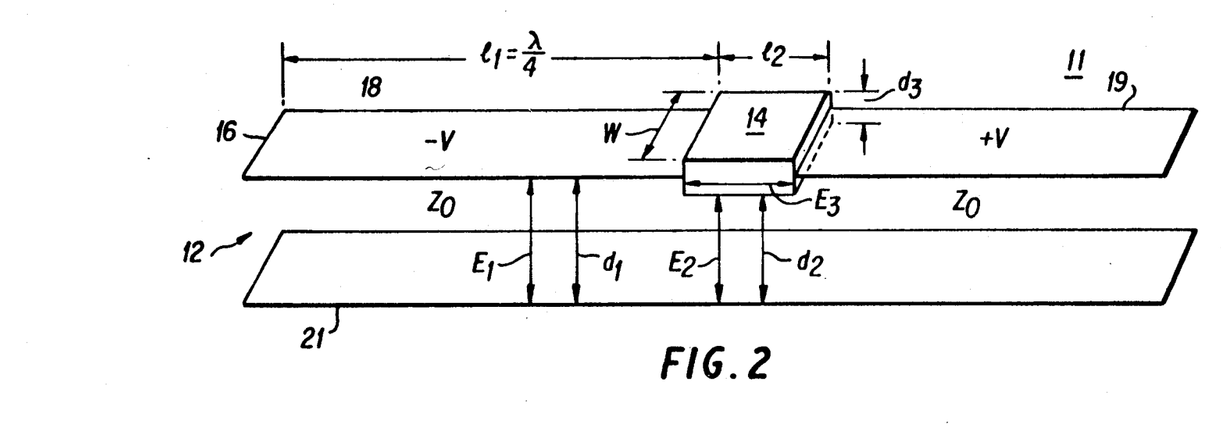
FIG. 2 is a schematic representation of two TEM transmission lines linked by a LASS switch.

In FIG. 2, $E_1$ represents the electric field between the transmission line pairs 18 and 21, and 19 and 21; $E_2$ represents the electric field between the LASS switch 14 and the line 21; and $E_3$ represents the electric field in the LASS switch 14. Further, $d_1$ represents the distance between the lines 18 and 21 and the lines 19 and 21, while $d_2$ the distance between the LASS switch 14 and the line 21. Further, $l_2$, $d_3$ and w represent the length, thickness and width, respectively, of the LASS switch 14, while $l_1$ represents the length of the transmission line segment 18.

The maximum electric field in a p-n junction is inversely proportional to log $(N_B)$ where $N_B$ is the background doping. Thus the maximum electric field is limited by the material purity. Assuming the LASS switch 14 is made of silicon having an $N_B$ on the order of about $10^{12}$ cm$^{-3}$ (a purity level commercially available), the maximum electric field in the switch, $E^3$, should be no greater than on the order of 200 kv/cm. Further, in order for the transmission line 11, considered as whole, to closely approximate a TEM transmission line, the length of the switch $l_2$, must generally be much less than the length of the transmission line segments $l_1$. As will be appreciated by the artisan the length ratio between the transmission line segment 18 and the switch 14, represented by the ratio $l_2/l_1$, and the relationship between the spacings $d_1$ and the thickness $d_3$ all affect impedence matching and hence reflection losses within the source. It should further be appreciated that the example of impedence matching discussed below is exemplary only and that acceptable impedence matching commensurate with maximum power flow can be achieved if the following relationships are maintained. The ratio $l_2/l_1$ should be between 0.01 and 0.50 consistent with the geometry of the transmission line. The ratio $d_2/d_3$ should be within the range of about 0.1 to 1.0 and the ratio $d_3/d_1-d_2$ should be within the range of about 1.0 to 10.0. As should be apparent, the various ratios defined above are presented as ranges since a change in any one of the ratios affects the others. For example, the larger the ratio $l_1/l_2$, the smaller the ratios $d_2/d_3$ and $d_3/d_1-d_2$ in order to maintain acceptable impedance matching.

Returning to the example of FIG. 2, the discharge of a transmission line segment preferably produces a pulse having a duration of half the microwave oscillation period desired, in double the transit time. Thus $l_1 = \lambda/4$. To avoid a mismatch between the transmission line section and the switch section, the switch length must be small compared to the transmission line length. Calculations have shown that consistent with the switch geometry limits discussed above, with $l_1$ about equal to 10 $l_2$, reflections are kept to an acceptable level. Since the electric field $E_3$ in the LASS switch is $2V/l_2$, the maximum voltage on the charged transmission line should be:

$$V = \frac{\lambda E_3 \eta_1}{8\sqrt{\epsilon}} \tag{2}$$

where $\eta_1 = l_1/l_2 = 0.1$ and $\epsilon$ is the dielectric constant of the material filling the transmission line spacing.

From equation (2), it is seen that the maximum voltage on the transmission line is fixed by the sustainable switch electric field $E_3$, the microwave wavelength, $\lambda$, the dielectric constant, $\epsilon$, and the dimensionless ratio, $\eta$. As alluded to above, one aspect of the invention is to permit operation at the maximum current and current density while minimizing reflections due to mismatches between transmission line sections and switch sections. To derive a general solution to maximize power flow, we first consider the Poynting power density and then consider the power density in the transmission line.

Since the Poynting power density is $E_1 \times H$ ($E_3$ being fixed), in order to maximize the Poynting power density one must maximize H. Since H is inversely proportional to the line impedance, it is desirable to decrease the impedance in order to increase H. The impedance of the transmission line can be expressed as:

$$Z_0 = \frac{d_1}{w} Z \tag{3}$$

where $Z = \sqrt{\frac{\mu}{\epsilon}}$. H can thus be written as:

$$H = \frac{I}{w} = \frac{V}{d_1 Z} \tag{4}$$

where $I = V/Z_0$. From equation (4), it is easily seen that H increases with decreasing $d_1$ (decreasing impedance). Since the power density in the switch ($P = E_3 \times J$) can only be maximized by operating at Jmax, the maximum current density sustainable by the switch, H can be expressed as:

$$H = J_{max} d_3 \tag{5}$$

Thus two conditions exist for increasing H; decreasing $d_1$ (hence the impedance) and increasing $d_3$. However, the process of decreasing $d_1$ and increasing $d_3$ cannot be extrapolated indefinitely since as $d_3$ approaches $d_1$, it has now been found that the mismatch in the transmission line becomes excessive leading to multiple reflections. Under the geometrical constraint that $d = d_2 + d_3/2$, calculations have shown that with $d_3$ less than or equal to $d_2/3$, reflections are kept to an acceptable level. Thus the conditions of maximizing $d_3$ and minimizing reflection leads to $d_3 = d_2/3$ (or $d_3 = 2d_1/7$).

Within the dimensional constraint for maximizing the current, the maximum power density in the transmission line is achievable only by maximizing the current density. Since the propagating voltage pulse in the transmission line is $V/2$, the current density, can be expressed as:

$$J = \left(\frac{V/2}{Z_0}\right)\left(\frac{1}{d_3 w}\right) \tag{6}$$

Substituting equation (2) for the voltage yields:

$$J = \frac{\lambda E_3 \eta_1}{16 Z d_1 d_3 \sqrt{\epsilon}} \tag{7}$$

Having established the relationship between $d_1$, $d_2$, and $d_3$ from maximum Poynting power condition, the dimension $d_2$ which results in operation at the maximum current density is:

$$d_2 = \left[\frac{\lambda E_3 \eta_1}{8 J_{max} Z \sqrt{\epsilon} (2\eta_2 + \eta_2^2)}\right]^{\frac{1}{2}} \tag{8}$$

where $\eta_2 = d_3/d_2$

Considering the preferred ratios of $l_2/l_1$, $d_2/d_3$ and $d_3/d_1-d_2$ discussed above, it can be stated that in general $d_1$ and $d_2$ are related as follows:

$$d_1, d_2 \propto \left[\frac{\lambda E_3 \eta_1}{8 J_{max} Z \sqrt{\epsilon} (A\eta_2 + \eta_2^2)}\right]^{\frac{1}{2}} \tag{8A}$$

where A = scalar in the range of from about 1.0 to 10.0

The maximum power density in the transmission line can be expressed as:

$$P_{max} = \frac{J_{max}(V/2)}{d_2 w} \tag{9}$$

Substituting $I = J d_3 w$ and equation (2) yields:

$$P_{max} = \frac{\lambda E_3 J_{max} \eta_1 \eta_2}{16 \sqrt{\epsilon}} \tag{10}$$

The power flowing in the transmission line is simply:

$$P_{source} = \frac{\lambda E_3 J_{max} \eta_1 \eta_2}{16 \sqrt{\epsilon}} \times d_2 w \tag{11}$$

Note that the power level can be chosen by scaling the width of the line ($d_2$ being fixed by maximum current density condition).

We now consider the optical to microwave energy gain. Considering each transmission line as an elemental microwave source, it is possible to calculate to the gain of an elemental source relative to the optical input energy, $W_{ph}$, used to operate the LASS switch. The optical input energy (photon energy) may be expressed as follows:

$$W'_{ph} = \frac{(l_2 d_3 w)(neV_{ph})}{Y\epsilon_f} \quad (12)$$

where n is the carrier density, e is the electronic charge, $V_{ph}$ is the bandgap energy (eV), Y is the avalanche gain and $\epsilon_f$ is the light coupling efficiency.

Substituting the expression $J = neV_d$, where $V_d$ is the carrier drift velocity, into equation (12) yields $$W'_{ph} = \frac{d_3 w V_{ph} J}{Y\epsilon_f V_d} \times \frac{\lambda \eta_1}{4} \quad (13)$$

The microwave energy $W\mu w$, corresponding to one switch operation in one transmission line section can be determined from the following relationship:

$$W'_{\mu w} = I\left(\frac{V}{2}\right)\left(\frac{J}{2}\right) \quad (14)$$

Substituting the expression for voltage and $T = \lambda$ into equation (14) yields:

$$W'_{\mu w} = (Jd_3 w)\left(\frac{\lambda E_3 \eta_1}{16\sqrt{\epsilon}}\right)\left(\frac{\lambda}{2c}\right) \quad (15)$$

Thus, the gain, G, defined as the ratio of the microwave output energy to the optical input energy is:

$$G = \frac{W'_{\mu w}}{W'_{ph}} = \left(\frac{E_3}{4V_{ph}}\right)\left(\frac{\lambda V_d}{2c}\right)(Y\epsilon_f) \quad (16)$$

or $$G = \left(\frac{E_3}{4V_{ph}}\right)\left(\frac{TV_d}{2}\right)(Y\epsilon_f) \quad (17)$$

Thus $$G = \left(\frac{E_3 l_2}{4V_{ph}}\right)\left(\frac{TV_d}{2l_2}\right)(Y\epsilon_f) \quad (18)$$

where:

$\frac{E_3 l_2}{4V_{ph}} = \frac{V_{LOAD}}{V_{ph}}$, the long term gain

This gain equation includes terms that take into account the inefficiencies of the optical systems. By employing the analysis above, it is now possible to design a practical and efficient microwave source for maximum power output within the electric field and current density constraints imposed by the switch.

ALTERNATE MICROWAVE SOURCE EMBODIMENTS

Figure 3:
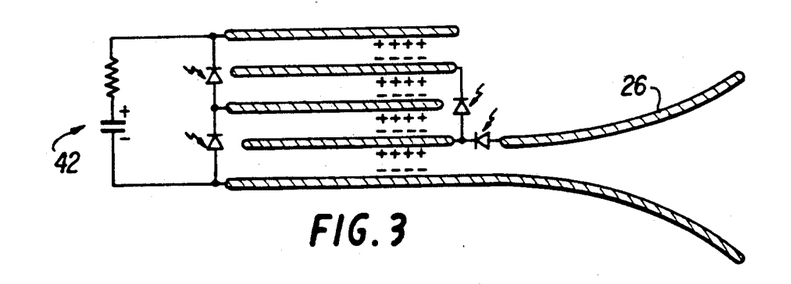
FIG. 3 is a sectional view of a microwave source comprising stacked or folded cascaded transmission lines and a transmission line charging circuit.

FIGS. 3 through 7 illustrate more compact versions of a LASS microwave source based on the concepts described above. In FIG. 3 a microwave source similar to that of FIG. 1A is in effect, "folded" to form a multi-element capacitor. The transmission line pairs are charged by a charging circuit 42. In the example illustrated four transmission lines are connected in cascade to each other and to the antenna 26. As can be appreciated by the charge accumulation notation in FIG. 3, the required alternate charging is achieved by the displacement current as the top and bottom plates are charged to a potential difference of nV where n is the number of transmission lines and nV the potential of the charging circuit 42. This geometry obviates the need for individual charging of the transmission lines.

Figure 4:
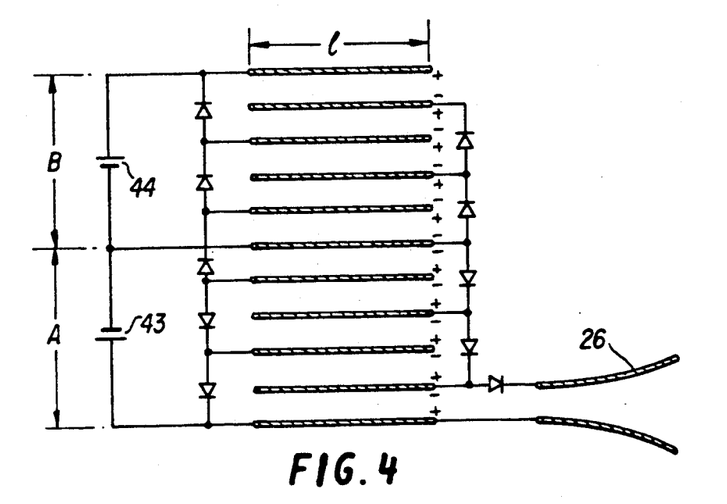
FIG. 4 is a sectional view of another embodiment of a microwave source comprising stacked or folded transmission lines and a transmission line charging circuit.

FIG. 4 is another example of a folded geometry illustrating how any number of stacked transmission line sets can be interconnected without requiring excessive charging voltages. In effect, the transmission line pairs of each "stack" are progressively charged from V to nV. The transmission line pairs of the next "stack" are charged from nV to V, where V can be either positive or negative.

In FIG. 4, the first stack of transmission lines, A, comprises five transmission line pairs, which are charged, in a manner similar to that of FIG. 3, by means of a charging circuit 43.

The second set of transmission lines, B, also comprises five transmission line pairs which are charged via a charging circuit 44.

Although the embodiment illustrated in FIG. 4 comprises stacked transmission lines of equal length, 1, it should be appreciated that in this embodiment, as well as in the other embodiments described herein, the transmission line segments can be of unequal length if it is desired to modulate the resulting microwave pulses. Further, the dielectric spacing and dielectric constants can be varied to attain a particular but fixed set of voltages for the various lines in a stack. Alternatively, the individual charging voltages can be varied dynamically by the use of active elements such as transistors to charge each transmission line selectively or by using resistive voltage dividers in a manner familiar to one skilled in the art. Further, embodiments are contemplated where the transmission lines are divided by junction devices or other switches into segments smaller than 1. Each segment can then be selectively connected into transmission line pairs of any desired length prior to charging or firing by selectively "closing" appropriate junction devices or switches.

Figure 4A:
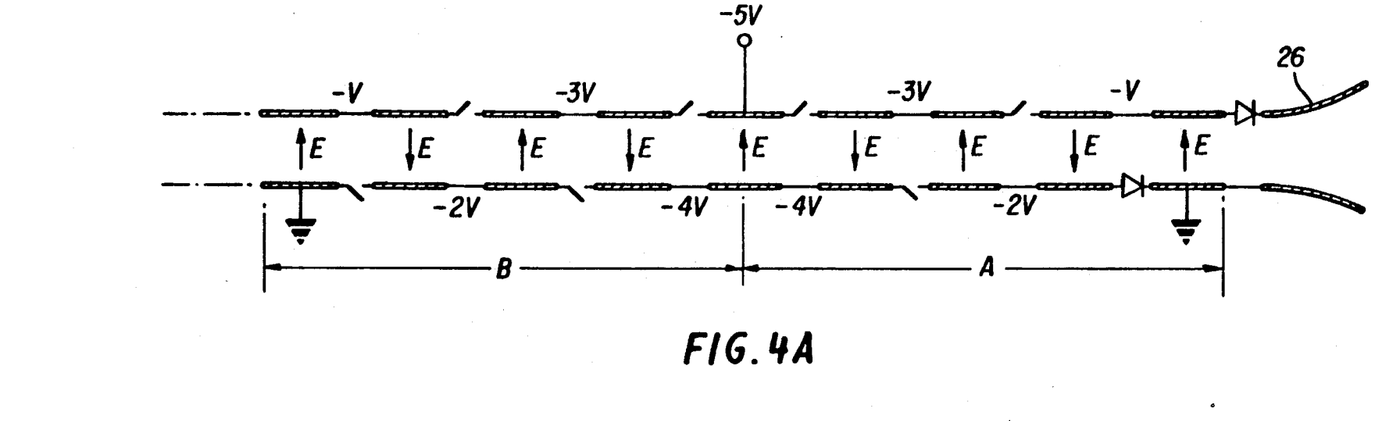
FIG. 4A is a linear representation of the folded geometry of FIG. 4.

FIG. 4A is a linear representation of the source of FIG. 4, illustrating similar, but unfolded, transmission line pair segments. Like the folded geometry of FIG. 4, the linear geometry of FIG. 4A is divided into two groups, A and B, which are connected to an antenna 26. In the example of FIG. 4A, the transmission line charge progressively varies by integers from ground potential to −5V and back to potential ground. The alternating direction of the electric field E between transmission line segments is indicated by appropriate arrows.

Figure 5:
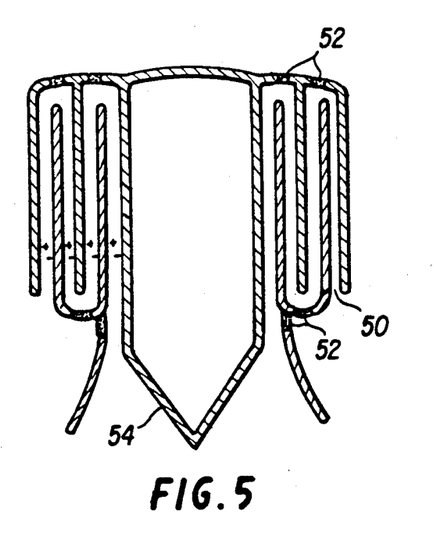
FIG. 5 is a sectional view of a compact microwave source comprising coaxial transmission lines.
Figure 6:
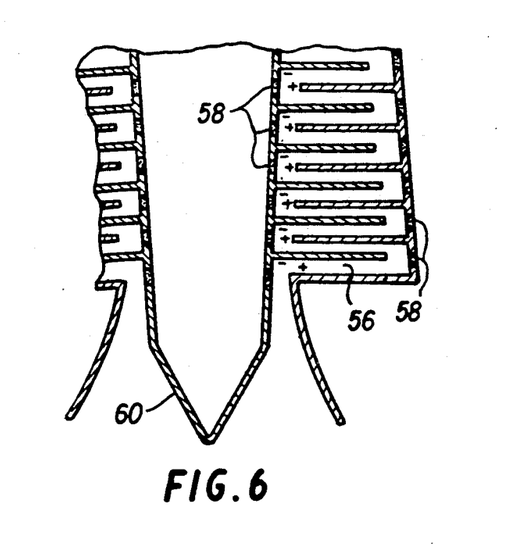
FIG. 6 is a sectional view of a compact microwave source comprising radial transmission lines.

FIGS. 5 and 6 illustrate coaxial and radial embodiments, respectively, of the same basic microwave source configuration but with increased compactness. Other compact geometrical configurations will also suggest themselves to the artisans upon examination of this description.

In FIG. 5, the transmission lines are formed as coaxial capacitors 50 separated by LASS diodes 52. In the example illustrated four transmission lines are cascaded into an antenna 54.

The radial geometry illustrated in FIG. 6 is even more compact. In this configuration, radial disc shaped transmission lines 56, switched through LASS diodes 58, are connected in cascade to a horn antenna 60. As will be apparent, a large number of such disc shaped segments can be stacked in a very compact space to permit generation of a very long train of microwave pulses.

Figure 7:
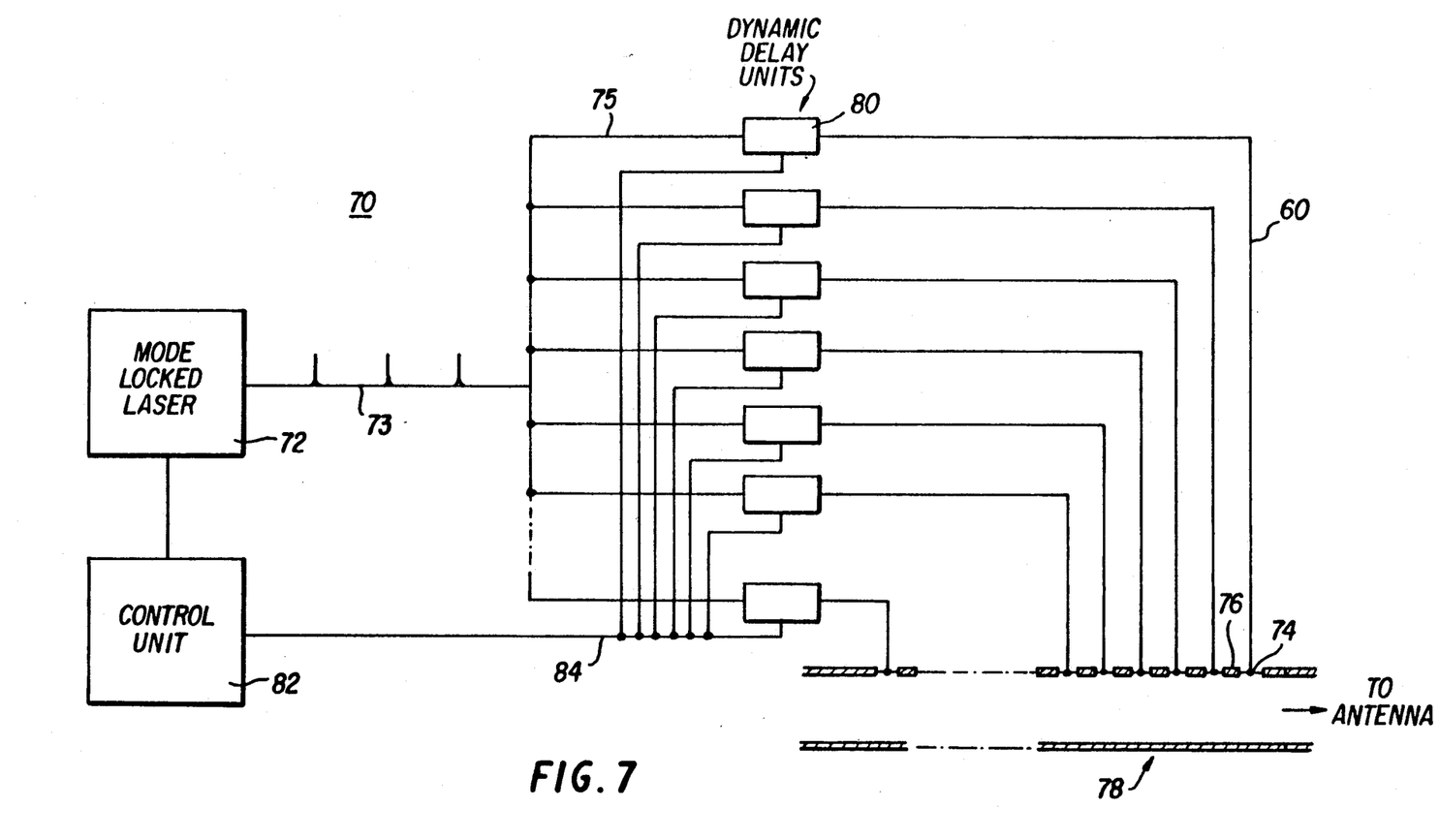
FIG. 7 is a functional representation of a microwave generating system using a LASS microwave source.

FIG. 7 depicts an exemplary microwave generation system 70 using a source similar to those described above. The system consists of a short pulse laser source 72, such as a mode-locked laser, capable of producing pulses 73 (initiating pulses) preferably having a pulse width of less than one-tenth of the period of the microwaves to be generated.

Each laser pulse 73 is fanned out in fan out circuit 75 to control a microwave source 78 in a manner described below and specifically to control the LASS diodes 74 of the source 78 which connect individual transmission line pairs 76 of the source in cascade. The pulses that are fanned out from the initiating pulse 73 are appropriately delayed and amplified. The amplication of the light pulses must provide sufficient energy to turn on the LASS switches The minimum energy, E, reaching the switch is E = switch volume x carrier density (about $10^{18} cm^{-3}$) x bandgap energy. The required timing accuracy of the fanned out pulses can be met to less than 5 picosecords, representing a distance in the fiber of about 1mm, an easily achievable fabrication accuracy.

As alluded to above, the LASS diodes 74 are controlled by means of dynamic delay units 80 which may be in the form of a KDP crystal or equivalent. The dynamic delay units 80 are operated under the control of a control unit 82, for example a programmed micro or mini-computer operated to vary the timing between individual pulses (FIG. 1B) via delay control lines 84 to thereby vary the instantaneous frequency, phase and waveform of the microwaves emanating from the source 78.

An important advantage of the microwave generating system 70 is that it is easy to phase multiple microwave generating systems since a single mode-locked laser pulse can be used to provide the timing for all the systems.

Figure 8:
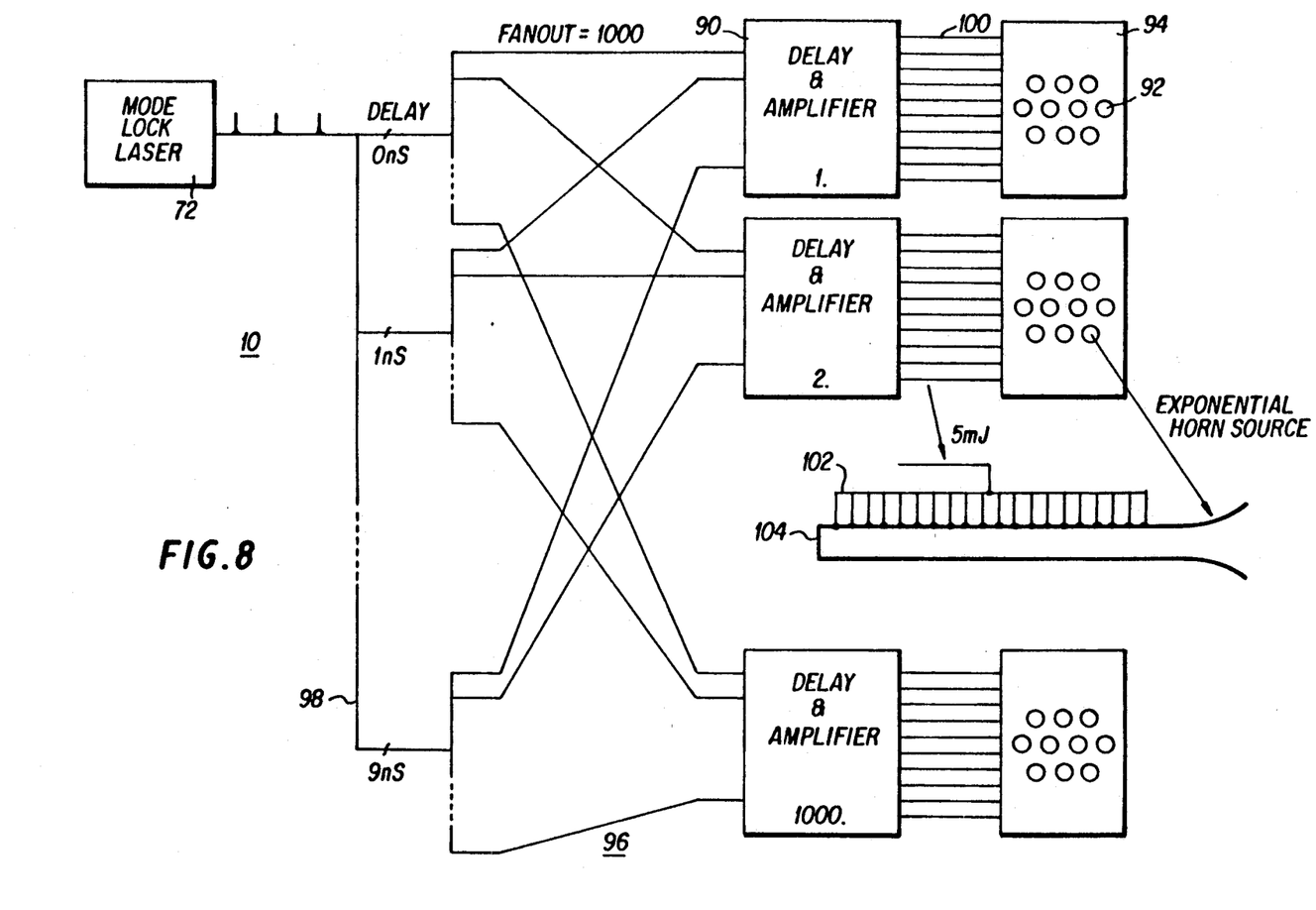
FIG. 8 is a functional representation of another embodiment of a microwave generating system using a LASS microwave source.

The embodiment of FIG. 8 is similar to that of FIG. 7 but uses a separate dynamic delay unit 90 for a plurality of sources 92 grouped in a source group 94 in order to provide a continuous pulse. For each source group 94 a fixed delay is provided by using a different optical path length as illustrated, or, as will be apparent to one of skill in the art, the appropriate delay can be obtained by using different fixed delay units. Within each source group 94, the operation of the individual sources 92 are under the control of the dynamic delay units 90. Thus, the relative phase of the individual sources 92 in a group of sources as well as the frequencies, and waveforms generated can be controlled as desired. As illustrated in FIG. 8, plurality of individual sources, each source receiving a laser pulse dynamically delayed relative to each other for proper phasing, can provide a coherent output for a phased array antenna system or source group. Each delay unit 90 receives appropriately delayed input pulses from the laser 72 by means of the primary and secondary fanning circuits, 98 and 96, respectively, which preferably comprise appropriately trimmed optical fibers.

The following is a non-limiting example of an operation of the microwave generating system according to FIG. 8. The laser 72, preferably a mode-locked laser, produces a train of pulses 73, which in the present example, comprises a train of pulses having a 10 ns period and 5mJ energy. A system having ten source groups 94 will require ten primary branches, 98, each of which fans out into ten secondary branches 96. The primary optical fiber fanning circuit 98 connected to the laser 72 will introduce fixed time delay into each primary branch of, for example, 0 to 9 ns in 1 ns increments. Assuming each source group 94 contains ten sources 92, each amplifier/delay unit 90 will fan out via lines 100 to each of the ten sources. Further, assuming each of the ten sources includes twenty cascaded transmission line pairs each of the lines 100 will fan out to twenty optical fibers 102, each optical fiber being connected to a LASS switch 104 for controlling one of the transmission line pairs.

Figures 9, 10, 10B:
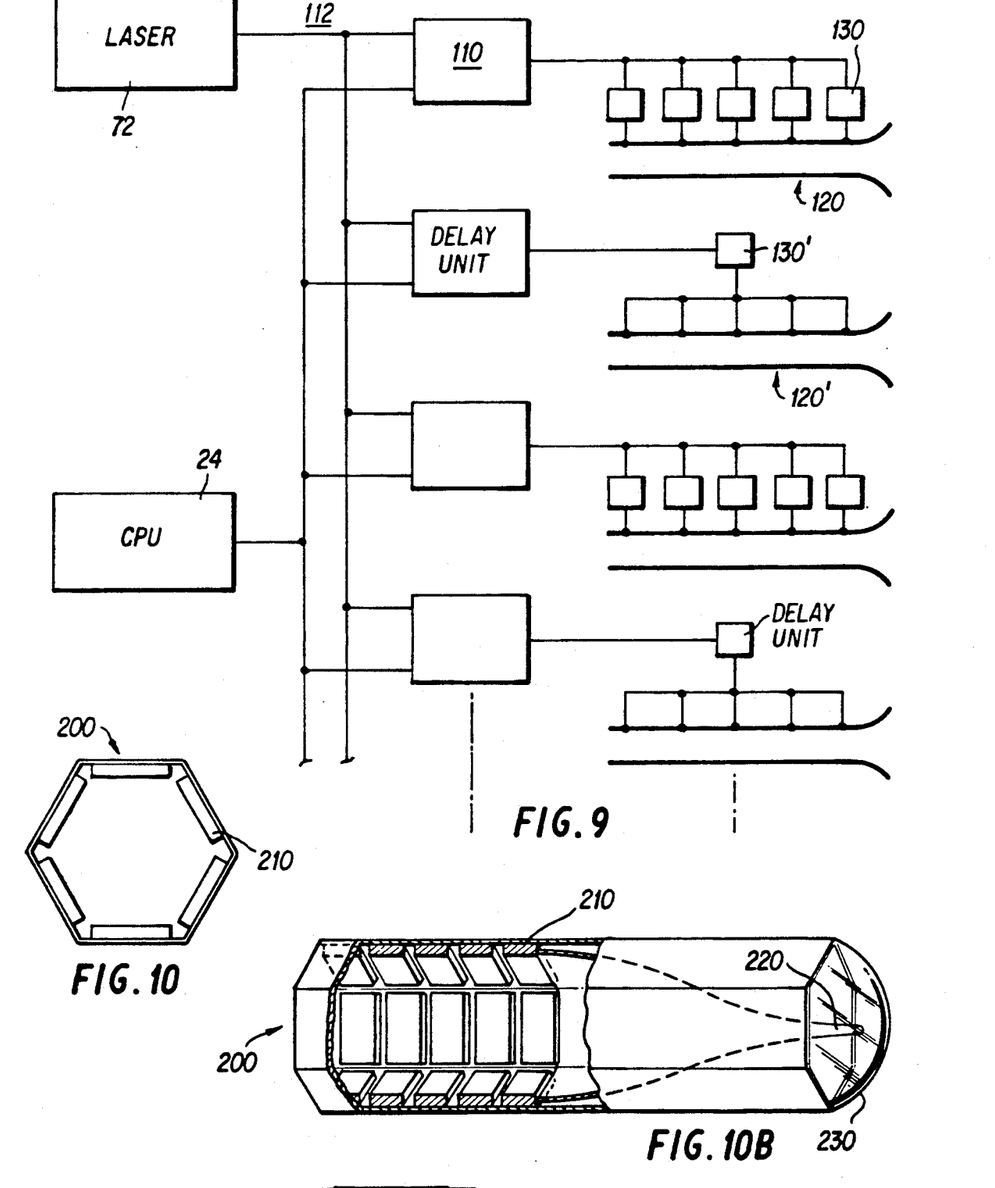
FIG. 9 is a functional representation of yet another embodiment of a microwave generating system using LASS microwave source.
FIG. 10 is a side view and FIG. 10B is a partial elevation in cutaway of a schematic representation of an exemplary microwave source module made from stacked or folded cascaded transmission lines.

Alternatively, as best seen in the embodiment of FIG. 9, a single dynamic delay unit 110 ca be used for each microwave source or group of sources 120. In this embodiment, an appropriate delay is provided for each microwave source 120 by a fanning circuit 112, which includes delay units 110. In addition, for the LASS diodes of each source, an additional delay unit 130 may be provided A single delay unit, 130' may be used to control all of the LASS switches of a source 120' or a plurality of delay units 130 may be used to control the LASS switches of a source 120. The delay units 110, 130 and 130' are preferably dynamic delay units under the control of a processor or similar control device. Thus, the relative phase of the microwaves from each source or group of sources as well as the frequencies and waveforms generated can be controlled for synthesizing a desired microwave pulse group without the need for introducing a modulator at a high power levels.

Figure 11:
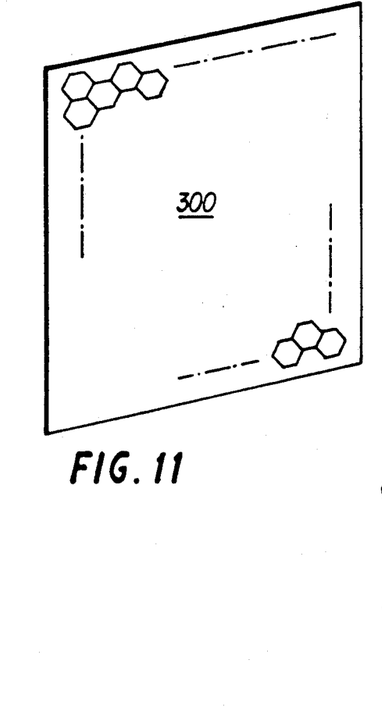
FIG. 11 is a schematic representation of an exemplary phased array antenna.

Additional examples of microwave sources constructed in accordance with the present invention are depicted in FIGS. 10 and 11. These specific examples are provided only for purposes of illustrating how the basic sources described above may be used in practice and should not be considered to limit the present invention in any way.

Figure 10A:
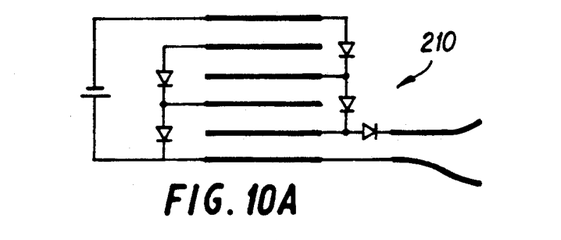
FIG. 10A is a schematic of a stacked transmission line from the module of FIG. 10B.

In the source configuration illustrated in FIGS. 10, 10A and 10B a source module 200 is depicted in the form of a hexagonal source. As will be apparent, any number of such sources may be packed side by side to form an array, but the present example will be described in terms of a single $10^8$ Watt, 3GHz source for producing a 15 cycle, 5 ns microwave pulse with 0.5 J per pulse.

In the present example, each source module 200 comprises 30 cascaded transmission lines for producing a 15 cycle microwave burst from thirty square wave pulses. Preferably, the thirty transmission lines are in the form of "stacks" 210, each similar to the stack illustrated in FIG. 3, with five transmission line pairs per stack (see FIG. 10A). Transverse mode suppression may be achieved by introducing transverse resistance, for example, longitudinal creases or cuts in the transmission line segments (not illustrated). The six stacks 210 are preferably connected to an exponential horn radiator 220 which outputs the synthesized microwave pulse through a electric lens 230 for focusing and impedence matching. The exponential horn may be constructed by tapering a conductor, integrated with the ground plane of the transmission lines, towards the center of the hexagonal source.

Figure 11A:
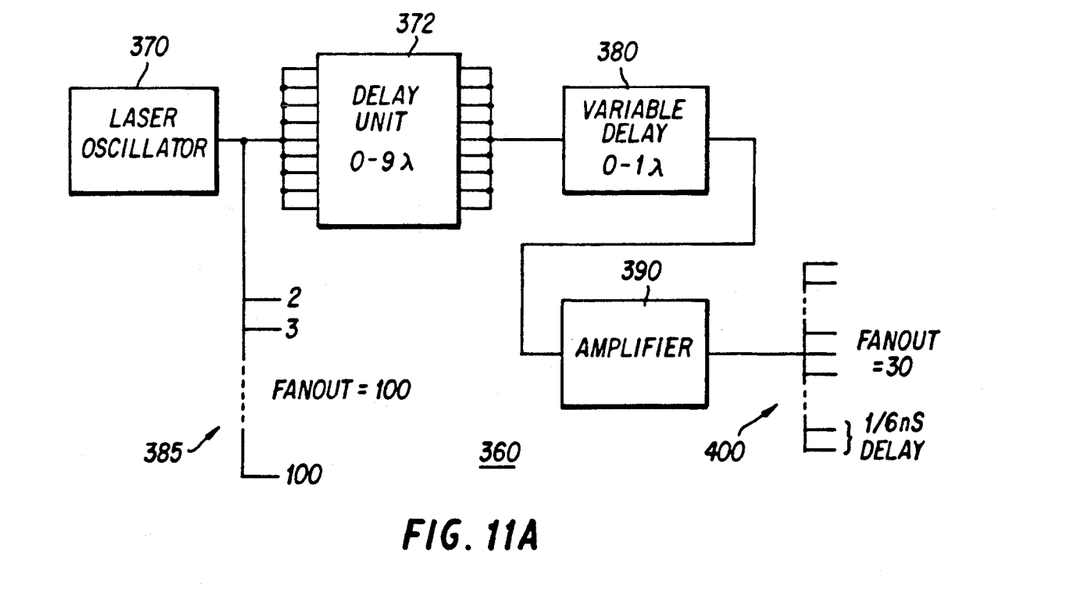
FIG 11A is a functional diagram of an optical delay system for controlling the phased array antenna of FIG. 11.
Figure 11B:
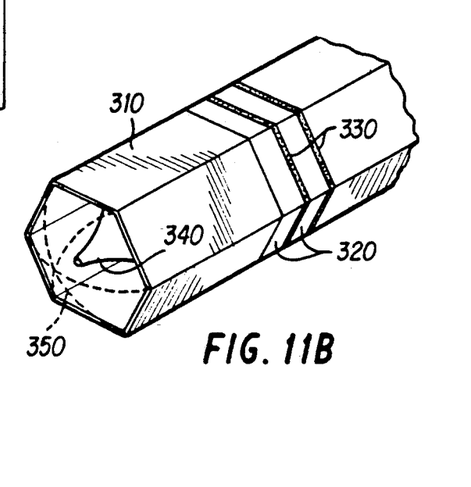
FIG. 11B is a partial, perspective view of a module of the phased array antenna of FIG. 11.

In FIGS. 11 and 11B, an exemplary embodiment comprising a phased array antenna 300 for producing $10^{10}$ watts from an array of one hundred closely-packed sources modules 310 is illustrated. The antenna 300 is designed to produce 50J per 5 ns pulse. In the example of FIGS. 11 and 11B, each source module comprises a cascade of transmission lines 320 and LASS switches 330 arranged to "belt" the surface of a hexagonal cylinder which defines the geometry of each source module 310. Each source module further includes an exponential horn radiator 340 and a dielectric lens 350 to impedence match and focus the microwaves.

The phased array antenna 300 is preferably controlled by an optical delay system 360, illustrated in FIG. 11A, which is similar to that described above with respect to FIG. 9. The optical delay system 360 comprises a laser 370 which preferably produces a pulse of appropriate period and energy. In the present example, the optical pulses are distributed by a fanning circuit 385 to each of one hundred source modules via a processor controlled delay system comprising an integrally selectible 0-9λ delay unit 372, followed by an infinitely variable 0-1λ delay unit 380, followed by an amplifier 390. The delay units 372 and 380 permit any delay from 0-10 to be selected. The amplifier 390 insures that the pulses reaching the LASS switches will have adequate energy to perform their switching function. Assuming each source module has thirty transmission line pairs, a second fanning circuit 400 is provided to deliver the pulses to each of the LASS switches with, for example, 1/6 ns of delay between pulses for a 3GHz frequency.

The foregoing description of various preferred embodiments of the invention have been presented for purposes of illustration and description. They are not intended to be exhaustive or to limit the invention to the precise forms disclosed, and obviously many modifications and variations are possible in light of the above teachings. The embodiments described were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A source for generating microwaves to a load comprising:
   a first TEM transmission line of a first length, charged to a first voltage and connected in cascade with said load by means of a first switch;
   a second TEM transmission line of a second length, charged to a second voltage, and connected in cascade with said first TEM transmission line by means of a second switch; and
   means for selectively controlling the state of said first and second switches to sequentially discharge said first and then said second transmission lines through said load.

2. The source of claim 1 wherein said first and second TEM transmission lines are impedance matched to each other and to said load.

3. The source of claim 2 wherein said load comprises an adiabatic transformer.

4. The source of claim 2 wherein said first and second transmission lines are of essentially equal length and each generates a microwave pulse of essentially equal duration.

5. The source of claim 2 wherein said first and second TEM transmission lines are of unequal length and generate microwave pulses of unequal duration.

6. The source of claim 4 wherein said length is equal to λ/4 where λ is the wavelength of the microwave to be generated.

7. The source of claim 1 wherein said first and second voltages are of equal magnitude and opposite charge.

8. The source of claim 1 wherein said first and second voltages are of unequal magnitude and opposite charge.

9. The source of claim 2 wherein said first and second switches each comprise a normally reverse biased light activated semiconductor junction switches operable to be switched on by a light pulse.

10. The source of claim 2 wherein said switches comprise multijunction diodes.

11. The source of claim 1 wherein said second switch is operated with a time delay from said first switch equal to the discharging transit time of the first transmission line.

12. The source of claim 1 wherein the second switch is operated with a time delay from said first switch of greater than discharging transit time of the first transmission line.

13. The source of claim 2 further comprising at least one additional transmission line connected in cascade with said second transmission line through an additional switch wherein each of said switches are operable to be switched at an arbitrary but sequential timing to produce a train of microwave pulses of arbitrary timing, phase and wavelength.

14. The source of claim 1 further comprising at least one additional transmission line connected in cascade with said second transmission line through an additional switch wherein each switch is operated with a time delay from the operation of the immediately preceding switch equal to the discharging transit time of the immediately preceding transmission line.

15. The source of claim 1 further comprising at least one additional transmission line connected in cascade with said second transmission line through an additional switch wherein each switch is operated with a time delay from the operation of the immediately proceeding switch equal to more than the discharging transit time of the immediately preceding transmission line.

16. The source of claim 1 wherein each of said switches has a length $l_2$ proportional to the length of the transmission line $l_1$ associated with said switch, wherein the ratio of $l_2/l_1$ is in the range on the order of 0.01 to 0.50.

17. The source of claim 1 wherein each of the transmission lines comprises a pair of conductors separated by a distance $d_1$ and said switches have a thickness $d_3$, wherein the ratio $d_1/d_3$ for a transmission and its associated switch is in the range of on the order of 1.0 to 10.0.

18. The source of claim 1 wherein each of said transmission lines comprises a pair of conductors separated by a distance $d_1$ and said switches are disposed between conductors of adjacent transmission lines and separated from opposing conductors by a distance $d_2$, wherein $d_1$ and $d_2$ are related as follows:

$$d_1, d_2 = \left[ \frac{\lambda E_3 \eta_1}{8JZ\sqrt{\epsilon}\,(A\eta_2 + \eta_2^2)} \right]^{\frac{1}{2}}$$

where:

J = switch current density $\eta_1 = l_2/l_1$ with $l_1$ being the length of a transmission line and $l_2$ the length of the switch associated with said transmission line;

$\eta_2 = d_3/d_2$;

λ = wavelength of microwaves being generated in free space;

ε = dielectric connstant of space between transmission line conductors;

~ = wave impedence of the transmission line;

A = scalar in the range of from about 1.0 to 10.,0;

$E_3$ = electric field in the switch.

19. The source of claim 1 wherein said source further comprises two or more transmission lines connected in cascade, said transmission lines comprising concentric shells of progressively increasing radii arranged concentrically about a common axis.

20. The source of claim 1 wherein said source further comprises two or more transmission lines connected in cascade, said transmission lines being formed of disklike members extending radially from a common axis, said members being axially displaced along said common axis.

21. The source of claim 1 wherein said source further comprises two or more transmission lines connected in cascade, said transmission lines being formed of stacked, planar members.

22. The source of claim 1 wherein said source further comprises two or more transmission lines connected in cascade, said transmission lines being linearly arranged relative to each other.

23. The source of claim 1 wherein said source further comprises two or more transmission lines connected in cascade through switches to said load, and wherein said switches comprise normally reverse biased diodes.

24. The source of claim 22 wherein said switches comprise multijunction diodes.

25. A system for generating microwaves comprising:
(a) a microwave source, said source comprising:
(i) a first TEM transmission line connected in cascade with a load by means of a first light activated solid state junction semiconductor switch;
(ii) a second TEM transmission line connected in cascade with said first TEM transmission line by means of a second light activated solid state junction semiconductor switch;
(b) means for selectively controlling the state of said first and second switches to selectively discharge said first and second transmission lines through said load; said controlling means comprising:
(i) a source of light;
(ii) means for selectively applying light from said light source to each of said switches;
(iii) means for controlling application of said light to said switches.

26. The system of claim 25 wherein said switches comprised light activated reverse biased diodes, each of said diodes being operable to be turned on by said light thereby discharging its respective transmission line and further operable to again become reversed biased upon recharging of its respective transmission line.

27. The system according to claim 26 wherein said source of light comprises a mode-locked laser for generating a train of periodic light pulses.

28. The system according to claim 27 wherein said means for selectively applying comprises a fanning circuit, connected to said mode-locked laser for selectively connecting said train of light pulses to said switches.

29. The system according to claim 28 wherein said fanning circuit comprises an optical fiber network for connecting said light pulses to said switches and said delay means comprises a microprocessor controlled dynamic delay means, operable to selectively and controllably delay the passage of said light pulses through said optical fiber network.

30. The system according to claim 28 wherein said fanning circuit comprises a plurality of optical fibers for connecting said light pulses to each of said switches, wherein each of said optical fibers introduces a predetermined time delay between said light source and a respective switch.

31. The system according to claim 30 further comprising a plurality of said microwave sources grouped in an array; and wherein said connecting means further comprises an additional fanning circuit having branches for connecting each of said optical fibers to each microwave source of said array; and further comprising a delay circuit, connected between said additional fanning circuit and said array for selectively introducing additional delay to each of said branches of said additional fanning circuit; and a plurality of transmission line fanning circuits having branches for selectively connecting the transmission lines of each of the plurality of microwave sources of said array to said delay circuit, said delay circuit being operable to produce phase coherence between the outputs of said microwave sources.

32. The system according to claim 31 further comprising a plurality of said arrays, each of said pluralities of arrays being connected to each of said optical fibers.

33. The system according to claim 28 further comprising a plurality of microwave sources, each of said sources being connected to said laser by said fanning circuit, and means for selectively and variably operating the means for controlling selective application of light.

34. The system according to claim 33 wherein said operating means comprises a programmable computer.

35. The system according to claim 34 further comprising an additional fanning circuit associated with each of said sources for connecting the switches of each of said sources to said means for controlling selective application of light; said additional fanning circuit having a delay means for controlling the operation of the switches of its associated source.

36. The system according to claim 35 wherein said delay means is selectively and variably operated by said programmable computer.

37. The system according to claim 26 wherein said source of light comprises light emitting diodes.

38. The system according to claim 37 wherein a light emitting diode is provided for each of said diodes.

39. The system according to claim 25 further comprising a plurality of said microwave sources grouped to form a phased array, said phased array being operable too project microwaves at a predetermined three dimensional coordinate.

40. The system according to claim 39 further comprising a second phased array spaced from said first-mentioned phased array, said second phased array being synchronized with said first-mentioned phased array too create a constructive microwave interference pattern at said predetermined three 41. The system according to claim 39 further comprising a plurality of said phased arrays, said plurality of phased arrays being spaced apart one from another, each array of said plurality of arrays having an independent source of light, the light sources of each of said plurality of arrays being synchronized whereby said plurality of arrays are operable to create a constructive microwave interference pattern at said three dimensional point in space.

42. A source for generating microwaves comprising:
a first TEM transmission line connected in cascade with a load by means of a first switch;
at least one additional TEM transmission line connected in cascade with said first TEM transmission line, each of said at least one additional transmission lines being connected in cascade by means of a respective switch;
means for controlling the state of said first switch and said respective switches to discharge said first and at least one additional transmission line through a load;
wherein each of said transmission lines comprises a pair of conductors separated by a distance $d_1$ and said switches are disposed between conductors of adjacent transmission lines and separated from opposing conductors by a distance $d_2$ and have a thickness $d_3$, wherein $d_1$ and $d_2$ related as follows:

$$d_1, d_2 = \left[ \frac{\lambda E_3 \eta_1}{8 J Z \sqrt{\epsilon} \, (4\eta_2 + \eta_2^2)} \right]^{\frac{1}{2}}$$

where
J = switch current density;
$\eta_1 = l_2/l_1$ with $l_1$ being the length of a transmission line and $l_2$ the length of the switch associated with said transmission line;
$\eta_2 = d_3/d_2$;
$\lambda$ = wavelength of microwaves being generated in free space;
$\epsilon$ = dielectric constant of space between transmission line conductors;
$Z$ = wave impedence of the transmission line;
A = scalar in the range of from about 1.0 to 10.0;
$E_3$ = electric field in the switch.

43. A source for generating microwaves comprising:
a first TEM transmission line connected in cascade to a load by means of a first switch;
at least one additional transmission line connected in cascade with said first TEM transmission line, each of said at least one additional transmission lines being connected in cascade by means of a respective switch;
means for controlling the state of said first switch and said respective switches to discharge said first and at least one additional transmission lines through said load;
said first and at least one additional transmission lines being disposed in a non-linear, folded geometry with respect to each other.

44. The source of claim 43 wherein said first and at least one additional transmission lines comprise concentric shells of progressively increasing radii arranged concentrically about a common axis.

45. The source of claim 43 wherein said first and at least one additional transmission lines are formed of disk-like members extending radially from a common axis, said members being axially displaced along said common axis.

46. The source of claim 43 wherein said first and at least one additional transmission lines are formed of planar members, said members being stacked upon each other.

47. A method of generating microwaves from a source having a first TEM transmission line connected in cascade with a load by means of a first switch and at least one additional TEM transmission line connected in cascade with the first TEM transmission line, each of said at least one additional transmission lines being connected in cascade by a respective switch, said method comprising:
charging each of said first and at least one additional transmission lines to voltages corresponding to the microwaves pulses to be generated;
sequentially discharging said first and at least one additional transmission line through said load by first closing said first switch and then sequentially closing said respective switches.

48. The method according to claim 47 wherein said step of charging comprises charging each alternate transmission line to voltages of a first polarity or to a zero voltage and each intervening alternate transmission line to voltages of an opposite polarity to said first voltage or to a zero voltage.

49. The method according to claim 47 wherein the step of sequentially discharging comprises sequentially closing said switches at an arbitrary timing to produce microwave pulses of arbitrary timing, phase and wavelength.

50. The method of claim 47 wherein the step sequentially discharging comprises sequentially closing said switches with a time delay between the closing of any two sequential switches being equal to the discharging transit time of the transmission line between said two sequential switches.

51. The method according to claim 47 wherein the step of sequentially discharging comprises sequentially closing said switches with a time delay between the closing of any two sequential switches being greater than the discharging transit time of the transmission line between said two sequential switches.

52. The method according to claim 47 wherein the step of charging comprises charging alternate transmission lines to voltages of equal magnitude and opposite charge.

53. The method according to claim 47 further comprising the step of adjusting the length of said transmission lines prior to the step of discharging.

54. The method according to claim 53 wherein the step of adjusting comprises closing a switch between adjacent transmission lines to effectively form a single transmission line from said adjacent transmission lines.

* * * * *